United States Patent [19]

Claverie

[11] 4,303,888

[45] Dec. 1, 1981

[54] DEMODULATION DEVICE FOR FREQUENCY MODULATED ELECTRICAL SIGNALS

[75] Inventor: Claude Claverie, Paris, France

[73] Assignee: Thomson-CSF, Paris, France

[21] Appl. No.: 78,803

[22] Filed: Sep. 25, 1979

[30] Foreign Application Priority Data

Sep. 29, 1978 [FR] France ............................ 78 27917

[51] Int. Cl.³ ............................................... H03D 3/00
[52] U.S. Cl. .................................... 329/103; 329/126;
455/214; 455/337
[58] Field of Search ...................... 329/101–104,
329/107, 110, 126, 137; 375/80, 82, 94;
455/214, 337

[56] References Cited

U.S. PATENT DOCUMENTS

| | | | |
|---|---|---|---|
| 3,307,112 | 2/1967 | Clark | 329/104 |
| 3,407,358 | 10/1968 | Ott | 329/103 X |
| 3,723,891 | 3/1973 | Whiteley | 329/103 |

*Primary Examiner*—Siegfried H. Grimm
*Attorney, Agent, or Firm*—Roland Plottel

[57] ABSTRACT

A frequency demodulation device having a circuit for limiting the amplitude of a frequency modulated signal, an integration circuit and a low pass filter. Two successive output signals from the amplitude limiting circuits are integrated in the integrating circuit in accordance with first and second predetermined time constants.

The signal is then fed to the filter which extracts the mean value from the output signal of the integrating circuit. This mean value is proportional to the modulated wave frequency and thus determines that frequency.

2 Claims, 1 Drawing Figure

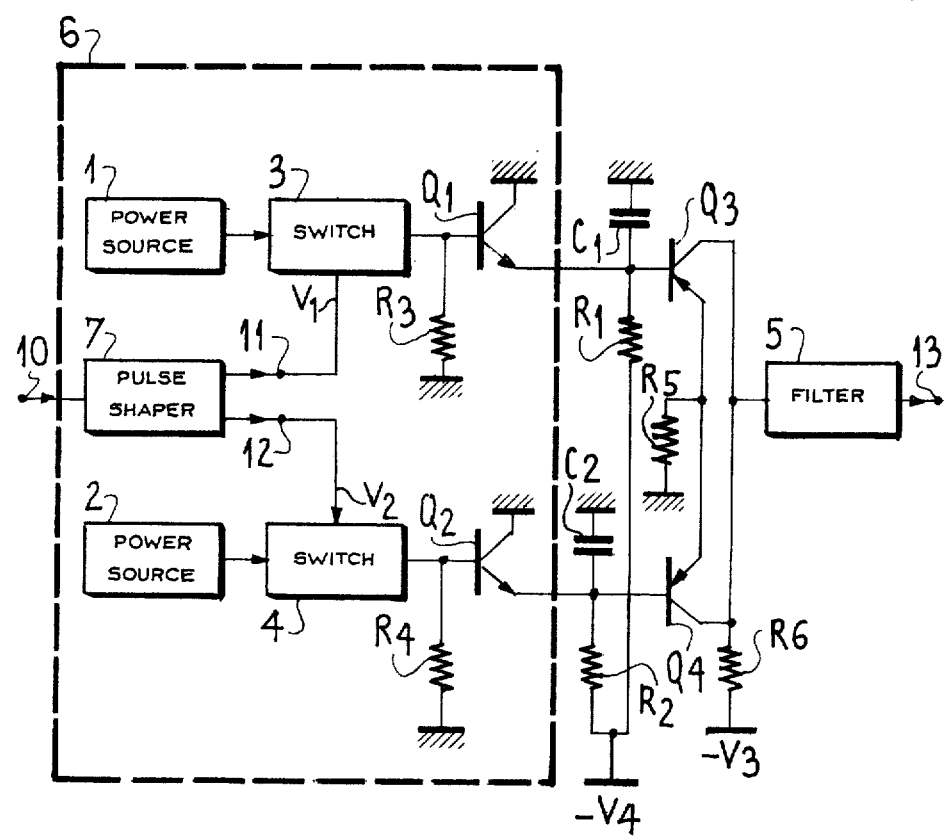

DEMODULATION DEVICE FOR FREQUENCY MODULATED ELECTRICAL SIGNALS

BACKGROUND OF THE INVENTION

The present invention relates to device making it possible to demodulate frequency-modulated waves and in particular simple devices operating up to carrier frequencies of a few dozen megahertz.

In order to demodulate a frequency-modulated wave, it is known to generate from said wave pulses of a given length and which are independent of the modulated wave frequency. These pulses are then integrated in order to obtain a mean value for these pulses which is proportional to the repetition frequency thereof and therefore to the frequency of the modulated wave.

There are numerous devices making it possible to perform this function and the most efficient of these uses a clipping circuit arranged in series with a monostable multivibrator and a low-pass filter.

The clipping circuit clips the frequency-modulated signal thus supplying square wave frequency-modulated signals from which the monostable multivibrator supplies pulses of predetermined, constant duration, and the low-pass filter extracts the mean value.

The disadvantages of this device are due to the necessity of having very short rise and fall times for these pulses if it is desired to obtain a correct operation (mean value of the signal obtained at the output from the device which is proportional to the frequency) at frequencies of a few dozen megahertz.

BRIEF SUMMARY OF THE INVENTION

The problem of the present invention is to obviate this disadvantage.

According to the invention, this problem is solved by a demodulation device permitting the demodulation of frequency-modulated signals, wherein it comprises amplitude limiting means having an input for receiving the signals to be demodulated and a direct output for supplying an output signal, a low-pass filter having an input coupled to the output of the amplitude limiting means and an output constituting the output of the device and integration means for coupling the output of the amplitude limiting means to the input of the low-pass filter and for integrating the output signal fronts, two successive fronts of the output signal being respectively integrated with a first and a second time constant.

DESCRIPTION OF THE DRAWING AND PREFERRED EMBODIMENTS

The invention is described in greater detail hereinafter relative to non-limitative embodiments and with reference to the attached drawing.

In the drawing, a clipping circuit 6 receives at an input terminal 10, which is also the input of the demodulating device, signals which are to be demodulated. This circuit has a resistor $R_3$ having a first terminal connected to a power source 1 across an electronic switch 3 controlled by a signal $V_1$ and a second terminal connected to earth. The first terminal of resistor $R_3$ is also connected to the base of a bipolar N-P-N transistor $Q_1$, whose collector is connected to earth and whose emitter constitutes a direct output from an amplitude clipping circuit 6. A resistor $R_4$ has a first terminal connected to a power source 2 across an electronic switch 4 controlled by a signal $V_2$ and a second terminal connected to earth.

The first terminal of resistor $R_4$ is also connected to the base of a bipolar N-P-N transistor $Q_2$, whose collector is connected to earth and whose emitter constitutes an inverted output of the amplitude clipping circuit 6. Signals $V_1$ and $V_2$ are complimentary ($V_2 = \overline{V_1}$) and are respectively supplied by the output terminals 11 and 12 of a pulse shaper 7 receiving at its input 10 the frequency-modulated signal.

It should be noted that in the present construction, the amplitude clipping circuit 6 is a comparator AM 685 of Advanced MicroDevices whose input (+) is receiving the signal to be clipped and whose input (−) is connected to earth.

The emitter of transistor $Q_1$ is connected to earth across a capacitor $C_1$, to a negative supply voltage $V_4$ across a resistor $R_1$ and to the base of a bipolar P-N-P transistor $Q_3$ whose emitter is connected to earth across a resistor $R_5$ and whereof the collector is connected on the one hand to the output terminal 13 across a low-pass filter 5 and on the other to a negative supply voltage $V_3$ across a resistor $R_6$.

The emitter of transistor $Q_2$ is connected to earth across a capacitor $C_2$, to voltage $V_4$ across a resistor $R_2$ and to the base of a transistor $Q_4$ whose emitter is connected to earth across a resistor $R_5$ and whereof the collector is connected on the one hand to the output terminal 13 across the low-pass filter 5 and on the other to the supply voltage $V_3$ across resistor $R_6$.

It should be noted that transistors $Q_3$ and $Q_4$ are of the opposite type to transistors $Q_1$ and $Q_2$ in order to reduce temperature variations in the device (compensation of temperature variations of base-emitter voltages).

The device functions in the following manner. The power sources 1 and 2 each supply a direct current of value $I_o$. When the value of the input voltage applied to terminal 10 is positive, the pulse shaper 7 supplies a voltage $V_1$ at its output terminal 11 and permits the closing of switch 3 and a voltage $V_2$ of value 0 which leaves switch 4 open. Conversely, when the value of the input voltage applied to terminal 10 is negative, switch 4 is closed and switch 3 open.

When switch 3 is open, the base potential of transistor $Q_1$ is equal to the potential of its collector, which has the effect of saturating this transistor. The charges which may be stored in capacitor $C_1$ are shunted to earth with a low time constant $\tau_1$ given by the following relationship: $\tau_1 = R'C_1$ if $R'$ is the resistance of the double collector-emitter junction of saturated transistor $Q_1$.

When switch 3 is closed, the base potential of transistor $Q_1$ is equal to $-R_3 \cdot I_o$, taking account of the direction of current $I_o$ (current $I_o$ travelling from resistor $R_3$ to power source 1). Consequently, transistor $Q_1$ is blocked and capacitor $C_1$ is charged with a time constant $\tau_2$ given by the following relationship:

$$\tau_2 = R_1 \cdot C_1$$

Capacitor $C_1$ will be charged until the voltage value at its terminals is equal to $-V_4$, but for a value of said voltage equal to $-R_3 \cdot I_o - V_{BE}$ transistor $Q_1$ starts to conduct ($V_{BE}$ being the voltage between the base and the emitter of said transistor) and the voltage at the terminals of capacitor $C_1$ remains blocked at said latter value.

It should be noted that for this construction, the value of voltage $-V_4$ is very high in absolute terms compared with the voltage $-R_3 \cdot I_o - V_{BE}$, permitting a quasilinear charge of capacitor $C_1$. When switch 3 is open, the cycle starts again as indicated hereinbefore.

Transistor $Q_3$, is connected in a common emitter configuration and sends the voltage variations to output 13 across low-pass filter 5, reversing the phase of said voltage variations and amplifying them.

The assembly comprising power source 2, switch 4, resistors $R_4$ and $R_2$, capacitor $C_2$ and transistors $Q_2$ and $Q_4$ functions in the same way as their corresponding elements, having the same value ($R_3=R_4$, $C_2=C_1$, $R_2=R_1$) as described hereinbefore, but the signals obtained are in phase opposition then due to the fact that control signals $V_1$ and $V_2$ are complimentary.

The signals from these two assemblies are summated in the common collector charge of transistors $Q_3$ and $Q_4$, then filtered by low-pass filter 5 permitting the extraction of their mean value therefrom.

It should be noted that the not indispensible summation of the two assemblies makes it possible to multiply by two the demodulated signal amplitude value, but also to multiply by two the value of the different frequencies which must be eliminated by the low-pass filter 5, which finally facilitates the filtering problem.

Experience has shown and calculations have confirmed that this mean value is proportional to the frequency of the wave received on the input terminal 10. Thus, said device constitutes a frequency demodulator.

It should be noted that for the device to operate correctly the charge time of capacitors $C_1$ or $C_2$ (time necessary for the voltage at their terminals to pass from a voltage close to OV to $-R_3 \cdot I_o - V_{BE}$) is less than half the cycle of the signals supplied at the terminals of resistors $R_3$ or $R_4$.

The invention is not limited to the embodiments described and represented hereinbefore and the device can in particular have the following variants.

In order to limit the peak discharge current value of capacitors $C_1$ and $C_2$, a small resistor is inserted between the capacitors and earth.

For collecting a demodulated signal of opposite polarity, the low-pass filter 5 can be connected to the coupled emitters of transistors $Q_3$ and $Q_4$.

Devices of this type can in particular be used in frequency modulation receivers.

What is claimed is:

1. A demodulation device for demodulation of frequency modulated signals comprising; amplitude limiting means having an input for receiving the signal to be demodulated, and a first path for limiting the amplitude of positive alternations of said frequency modulated signals and providing a first output, and a second path for limiting the amplitude of negative alternations of the frequency modulated signal and providing a second output; integration means connected to receive the first and second outputs of said amplitude limiting means for integrating the signals therefrom and for integrating said signals with a first and a second time constant; said integration means further comprises first and second identical circuits coupled respectively to the first and second outputs of the amplitude limiting means, each circuit comprises a transistor having a base coupled to the corresponding output of the amplitude limiting means, and a capacitor and a charging resistor coupling the base of the transistor to ground and a reference voltage source in such a way that each capacitor is charged by the reference voltage through the charging resistor toward a voltage of predetermined value in accordance with the first time constant, and then discharged across the amplitude limiting means in accordance with a second time constant; and a low-pass filter having an input coupled to receive signals from the outputs of the transistors.

2. A demodulation device according to claim 1, wherein each transistor has a collector and an emitter, each transistor is connected in a common emitter configuration and its collector is coupled to the input of the low-pass filter.

* * * * *